(12) United States Patent
Katz et al.

(10) Patent No.: US 6,387,727 B1
(45) Date of Patent: *May 14, 2002

(54) DEVICE COMPRISING N-CHANNEL SEMICONDUCTOR MATERIAL

(75) Inventors: Howard Edan Katz, Summit; Wenjie Li, North Plainfield, both of NJ (US); Andrew J Lovinger, Arlington, VA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/476,511

(22) Filed: Jan. 3, 2000

Related U.S. Application Data

(63) Continuation-in-part of application No. 09/280,103, filed on Mar. 29, 1999.

(51) Int. Cl.$^7$ ............ H01L 51/40; H01L 21/66; G01R 31/26

(52) U.S. Cl. ............... 438/99; 438/17; 257/40

(58) Field of Search ............ 438/99, 17; 257/40

(56) References Cited

U.S. PATENT DOCUMENTS 4,611,385 A * 9/1986 Forrest et al. ............ 29/574

OTHER PUBLICATIONS

A. Dodabalapur, et al. "Organic Heterostructure Field–Effect Transistors", *Science*, vol. 269, pp. 1560–1562 (1995).

F. Garnier, et al. "Structural basis for high carrier mobility in conjugated oligomers", *Synthetic Metals*, vol. 45, pp. 163–171 (1991).

A.R. Brown, et al. "Logic Gates Made from Polymer Transistors and Their Use in Ring Oscillators", *Science*, vol. 270, pp. 972–974 (1995).

F. Garnier, et al. "All–Polymer Field–Effect Transistor Realized by Printing Techniques", *Science*, vol. 265, pp. 1684–1686 (1994).

H.E. Katz, "Organic molecular solids as thin film transistor semiconductors", *J. Mater. Chem.*, vol. 7, No. 3, pp. 369–376 (1997).

H.E. Katz, et al. "Oligo–and Polythiophene Field Effect Transistors", Chapter 9, *Handbook of Oligo–and Polythiophenes*, D. Fichou, ed., Wiley–VCH (1999).

A. Dodabalapur, et al. "Complementary circuits with organic transistors", *Appl. Phys. Lett.* vol. 69, No. 27, pp. 4227–4229 (1996).

(List continued on next page.)

*Primary Examiner*—Alexander G. Ghyka
(74) *Attorney, Agent, or Firm*—Scott J. Rittman

(57) ABSTRACT

The invention provides a device comprising an improved n-channel semiconducting film, the film formed from a fused-ring tetracarboxylic diimide compound which exhibits a field effect electron mobility greater than 0.001 cm$^2$/Vs, advantageously greater than 0.03 cm$^2$/Vs, in film form. Contemplated compounds include naphthalene 1,4,5,8, tetracarboxylic acid diimides, naphthalene 2,3,6,7 tetracarboxylic acid diimides, anthracene 2,3,6,7-tetracarboxylic acid diimides, and heterocyclic variants thereof. The n-channel compounds are capable of being significantly soluble in common organic solvents, allowing for solution deposition of active semiconductor films, and are also capable of possessing significant volatility, such that vapor phase deposition, where desired, is relatively facile. It is also possible for the compounds to display the desirably high n-channel mobilities and on/off ratios even when operated in air.

5 Claims, 1 Drawing Sheet

OTHER PUBLICATIONS

M.A. Alam, et al. "A Two-Dimensional Simulation of Organic Transistors", *IEEE Transactions On Electron Devices*, vol. 44, No. 8, pp. 1332–1337 (1997).

J. G. Laquindanum, et al. "n-Channel Organic Transistor Materials Based on Naphthalene Frameworks", *J. of the American Chemical Society*, vol. 118, No. 45, pp. 11331–11332 (1996).

M. Adachi, et al. "Spectral Similarity and Difference of Naphthalenetetracarboxylic Dianhydride, Perylenetetracarboxylic Dianhydride, and Their Derivatives", *J. Phys. Chem.*, vol. 99, pp. 14240–14246, (1995).

\* cited by examiner

DEVICE COMPRISING N-CHANNEL SEMICONDUCTOR MATERIAL

CROSS-REFERENCE TO RELATED APPLICATION

This application is a continuation-in-part of U.S. application Ser. No. 09/280,103 filed on Mar. 29, 1999.

BACKGROUND OF THE INVENTION

1. Field of the Invention

The invention relates to devices containing organic semiconductor materials, in particular thin film transistors containing such materials.

2. Discussion of the Related Art

Organic thin film transistors (TFTs) are expected to become key components of the plastic circuitry in, among other things, display drivers of portable computers and pagers, and memory elements of transaction cards and identification tags, where ease of fabrication, mechanical flexibility, and moderate operating temperatures are important considerations. A typical organic TFT is shown in FIG. 1. The TFT contains a source electrode 10, a drain electrode 12, a gate electrode 14, a gate dielectric 16, a substrate 18, and the semiconductor material 20. When the TFT operates in an accumulation mode, the charges injected from the source 10 into the semiconductor are mobile and conduct the source-drain channel current, mainly in a thin channel region within about 100 Angstroms of the semiconductor-dielectric interface. (See, e.g., M. A. Alam et al., "A Two-Dimensional Simulation of Organic Transistors," *IEEE Transactions on Electron Devices*, Vol. 44, No. 8(1997).) In the configuration of FIG. 1, the charge need only be injected laterally from the source 10 to form the channel. In the absence of a gate field, the channel ideally has few charge carriers, and there is ideally no source-drain conduction. The off current is defined as the current flowing between the source 10 and the drain 12 when charge has not been intentionally injected into the channel by the application of a gate voltage, and for an accumulation mode TFT, this occurs for a gate-source voltage more positive (for p-channel) or negative (for n-channel) than a certain voltage known as the threshold voltage. (See, e.g., S. M. Sze, *Semiconductor Devices—Physics and Technology*, John Wiley & Sons (1985).) The on current is defined as the current flowing between the source 10 and the drain 12 when the channel is conducting. For a p-channel accumulation-mode TFT, this occurs at a gate-source voltage more negative than the threshold voltage, and for an n-channel accumulation mode TFT, this occurs at gate-source voltage more positive than the threshold voltage. It is desirable for this threshold voltage to be zero, or slightly positive, for n-channel operation. Switching between on and off is accomplished by the application and removal of an electric field from the gate electrode 14 across the gate dielectric 16 to the semiconductor-dielectric interface, effectively charging a capacitor.

Organic semiconductors provide the switching and/or logic elements in such TFTs. Significant progress has been made in the development of these semiconductors, with mobilities well above 0.01 cm$^2$/Vs and on/off ratios greater than 1000 demonstrated for several classes of compounds, including compounds capable of operation in air. With these properties, TFTs are capable of use for applications such as pixel drivers for displays and identification tags. However, most of the compounds exhibiting these desirable properties are p-type, meaning that negative gate voltages, relative to the source voltage, are applied to induce positive charges (holes) in the channel region of the device.

Yet, one important type of TFT circuit, known as a complementary circuit, desirably contains an n-type semiconductor material exhibiting desirable properties. (See, e.g., A. Dodabalapur et al., "Complementary circuits with organic transistors," *Appl. Phys. Lett.*, Vol. 69, No. 27, 4227 (1996).) The fabrication of complementary circuits requires at least one p-channel TFT and at least one n-channel TFT (n-channel indicating that positive gate voltages, relative to the source voltage, are applied to induce negative charges into the channel region of the device). In particular, simple components such as inverters have been realized using complementary circuit architecture. Advantages of complementary circuits, relative to ordinary TFT circuits, include lower power dissipation, longer lifetime, and better tolerance of noise. It is often desirable to have the mobility and on/off ratio of an n-channel device be of similar magnitude to the mobility and on/off ratio of a p-channel device. Hybrid complementary circuits using an inorganic n-channel semiconductor are known, as reflected in A. Dodabalapur et al., *Appl. Phys. Lett.*, Vol. 68, 2264 (1996), but for ease of fabrication, an organic n-channel semiconductor material is desired.

Only a limited number of materials have been developed for the n-type component of such organic complementary circuits, however. Specifically, buckminsterfullerene ($C_{60}$) exhibits a mobility of 0.08 cm$^2$/Vs but is unstable in air. Perfluorinated copper phthalocyanine has a lower mobility, about 0.03 cm$^2$/Vs, but is generally stable to air operation. Other n-channel semiconductors, including some based on naphthalene frameworks, have also been reported, but with lower mobilities. (See, e.g., J. G. Laquindanum et al., "n-Channel Organic Transistor Materials Based on Naphthalene Frameworks," *J. Am. Chem. Soc.*, Vol. 118, 11331 (1996).) One such naphthalene-based n-channel semiconductor, tetracyanonaphthoquinodimethane (TCNNQD), is capable of operation in air, but the material has displayed a low on/off ratio and is also difficult to prepare and purify. Moreover, there have been no n-channel organic materials capable of being deposited onto a substrate from solution, e.g., as opposed to sublimation, and many organic n-channel materials are actually highly insoluble or unstable to dissolution. In addition, the high-mobility (>0.01 cm$^2$/Vs) compounds previously reported are highly absorbing in the visible region of the spectrum.

Due to the advantages offered by complementary TFT circuits, improved organic n-channel materials are desired, in particular organic n-channel materials exhibiting high performance, easy processability, and stability in air, and, advantageously, also transparency to visible light.

SUMMARY OF THE INVENTION

The invention provides a device comprising an improved n-channel semiconducting film. The n-channel semiconducting film comprises a fused-ring tetracarboxylic diimide compound which exhibits a field effect electron mobility greater than 0.001 cm$^2$/Vs, advantageously greater than 0.03 cm$^2$/Vs in film form. Mobilities exhibited are among the highest reported for n-channel materials, e.g., in the range of 0.001–0.16 cm$^2$/Vs. In addition, the n-channel film of the invention is capable of providing on/off ratios of at least 100, advantageously at least 1000, more advantageously at least 50,000 (with the off current measured with a zero or positive gate-source voltage and a drain-source voltage between zero and 100 volts, the on current measured with a gate-source voltage at or below 100 V and a drain-source voltage between zero and 100 volts, not exceeding the drain-source voltage used for measuring the off current, and employing a gate dielectric with a capacitance of $1.1 \times 10^{-8}$ F./cm$^2$).

Contemplated compounds include naphthalene 1,4,5,8 tetracarboxylic acid diimides, naphthalene 2,3,6,7 tetracarboxylic acid diimides, anthracene 2,3,6,7-tetracarboxylic acid diimides, and heterocyclic variants thereof. One advantageous group of compounds is naphthalene 1,4,5,8-tetracarboxylic acid diimides with linear chains of four to twelve saturated atoms, generally carbon atoms, affixed to each of the two imide nitrogens. In another advantageous group, instead of the linear chains, the compounds have an electron deficient benzyl group attached to each of the two imide nitrogens. The compounds are shown below, where R designates, such linear chains or benzyl groups.

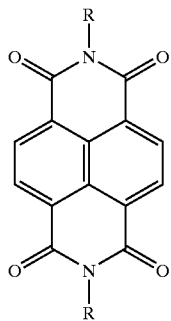

Advantageously, at least a portion of the substituents on the carbons of the linear chains or benzyl groups are fluoro substituents, which appear to improve the capacity for operation in air.

The n-channel semiconductor compounds of the invention offer advantages over other, previously reported n-channel compounds. For example, the compounds are capable of being significantly soluble in common organic solvents, allowing for solution deposition of active semiconductor films. The compounds are also capable of possessing significant volatility, such that vapor phase deposition, where desired, is relatively facile. It is possible for the compounds to display the desirably high n-channel mobilities and on/off ratios even when operated in air. Also the n-channel films are capable of being formed such that they are relatively transparent to visible light. In addition to individual transistors, it is possible to form a useful complementary circuit, e.g., an inverter circuit, using the n-channel organic compounds of the invention. In fact, according to the invention, it is possible to form a complementary circuit by solution deposition of both the p-channel and n-channel semiconductors, where the resultant circuit displays useful inverter activity and is operational in air.

DETAILED DESCRIPTION OF THE INVENTION

Figure 1:
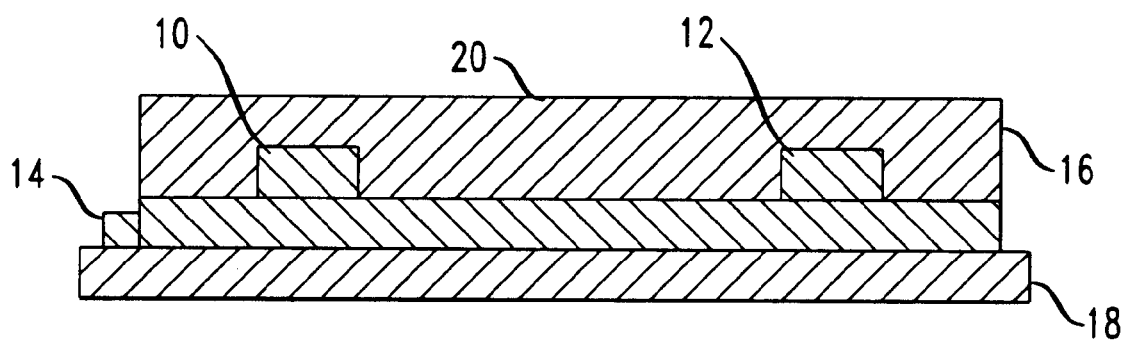
FIG. 1 illustrates a typical organic thin film transistor.

The invention provides a device comprising an improved n-channel semiconducting film, the film comprising a fused-ring tetracarboxylic diimide compound which exhibits a field effect electron mobility greater than 0.001 cm$^2$/Vs. Advantageously, the mobility is greater than 0.03 cm$^2$/Vs. In addition, the n-channel film of the invention is capable of providing on/off ratios of at least 100, advantageously at least 1000, more advantageously at least 50,000. Moreover, these properties are attainable in air, i.e., during exposure of the device and/or the film to air.

The compounds of the invention take into account several parameters that contribute to desirable properties. The lowest lying unoccupied molecular orbital of the compound is at an energy that allows for injection of electrons at useful voltages from metals with reasonable work functions. The solid state structure of the material has the individual molecules packed such that the orbitals of the conjugated system (containing the aromatic rings and/or the imide carbonyl groups) of adjacent molecules are able to interact, leading to high crystal mobility. The direction of this interaction has a component parallel to the direction of desired current flow in a device using this material as the active layer. The morphology of the films formed by the material is substantially continuous, such that current flows through the material without unacceptable interruption. In addition, to confer the advantages of facile processing from solution and/or stability to operation in air, the compound structures allow the materials to assemble into active films from solution. It is also possible to form films that are not unduly sensitive and/or permeable to environmental contaminants such as oxygen and water vapor.

In particular, the compounds of the invention contain a conjugated core structure having two or more fused aromatic rings along with electron withdrawing dicarboxylic acid imide substituents. This conjugated structure generally has a desirable lowest unoccupied molecular orbital (LUMO) energy level of about 3.5 to about 4.6 eV with reference, to the vacuum energy level. (As known in the art, LUMO energy level and reduction potential approximately describe the same characteristics of a material. LUMO energy level values are measured with reference to the vacuum energy level, and reduction potential values are measured in solution versus a standard electrode. The allowable range for both parameters according to the present car invention is about 1.1 eV. Thus, either property may be used to define the compound of the devices of the present invention. As also known in the art, defining reduction potential in terms of a standard electrode means that the reduction potential is measured relative to electrode potential. A standard calomel electrode commonly used is 4.2 eV. In the case of a 4.2 eV calomel electrode, the reduction potential equivalent to a LUMO energy level of about 3.5 to about 4.6 eV is about −0.7 to about +0.4 eV versus standard calomel electrode. As known in the art, LUMO energy level is typically measured by analyzing photoemission spectra, e.g., x-ray or ultraviolet, and reduction potential is typically measured by electrochemical potential scanning.)

Typically, a combination of two dicarboxylic acid imide groups and two or three fused aromatic rings provides useful properties, as in naphthalene tetracarboxylic acid diimides and anthracene tetracarboxylic acid diimides. Contemplated compounds include naphthalene 1,4,5,8 -tetracarboxylic acid diimides, naphthalene 2,3,6,7 tetracarboxylic acid diimides and anthracene 2,3,6,7-tetracarboxylic acid diimides. It is possible for some of the carbons of the aromatic rings to be replaced by heteroatoms, or for some of the carbons of the rings to be halogenated or otherwise contain small substituents—subject to the requirements that the orbital energies be within the useful range and that the compounds be chemically, photochemically, and thermally stable. The aromatic cores should not be so large that the compounds become difficult to process from solution or at ambient temperatures, and maintaining less than 8 fused rings (counting both the fused aromatic rings and the cyclic imide groups) is therefore desirable. Naphthalene 1,4,5,8,5 tetracarboxylic acid diimides have been shown to be useful, in particular N,N'-bis(1H,1H-perfluorooctyl)-, N,N'-bis(1H, 1H-perfluorobutyl)-, and N,N'-dioctyl naphthalene-1,4,5,8-tetracarboxylic acid diimide derivatives (where H indicates a chain position that is not fluorinated while the other chain positions are fully substituted with fluoro groups), as well as N,N'-bis(4-trifluoromethylbenzyl)napthalene-1,4,5,8-tetracarboxylic acid diimide.

The molecules are substituted with groups that allow for close packing of the conjugated cores, and that induce assembly of the compounds into thin films with useful molecular orientation and bulk morphology, particularly from solution. Linear chains having a length of four to twelve atoms are is typically useful, with chains of 8 atoms being particularly useful. Electron-deficient benzyl rings are similarly useful. It is convenient and beneficial to attach these chains to imido nitrogen atoms of dicarboxylic acid imide substituents on the conjugated cores.

It is advantageous to avoid substituents that tend to interfere with close approach of the conjugated cores. Such substituents include branched substituents such as tertiary butyl groups, and aromatic rings, where such groups or rings are oriented in such a way that the substituents pose a significant steric barrier to arrangements of the ring cores that are favorable for electron transfer among molecules. It is possible for substituents to be oriented out of the plane of the cores but still not interfere with their close approach if suitable stacking geometries are possible. It is also possible that properly selected substituents will promote this desired close approach. In addition, chains longer than twelve atoms are possible, but tend to lower the solubility and/or volatility of the compounds.

The n-channel semiconductor compounds of the invention exhibit decreased sensitivity and/or permeability to oxygen. In one approach, this characteristic is provided by incorporating additional electron withdrawing substituents, such that the lowest unoccupied molecular orbital is at the higher end of the energy range (injected electrons more stable) relative to vacuum. Suitable substituents include heavily fluorinated alkyl chains and electron-deficient benzyl groups. Such groups provide an electron-withdrawal effect that is inductive in nature. A limitation to this approach is that if the orbital energy is too high, such that a radical anion formed from the compound is too stable, the compound becomes susceptible to unintentional n-doping, leading to high off currents and lower on/off ratios. In fact, this limitation is found in the prior art compound TCNNQD, noted above.

In a second approach, the substituent attached to the imide nitrogens is designed to fill as much space as possible in the crystal, other than the space already occupied by the conjugated aromatic cores, subject to allowing the conjugated systems to interact. This is typically accomplished by increasing the effective cross-section of the linear chain, for example by incorporating fluoro substituents on at least some of the carbon atoms of the chain. One result of doing so is to hinder access to the active parts of the device, particularly the interfacial regions near the source and drain electrodes and near the dielectric (the channel region) to deleterious environmental agents such as oxygen and water. In addition, incorporation of heteroatoms such as oxygen atoms, instead of some of the carbon atoms in the chains, is contemplated. When using chains containing fluoro substituents, it is useful for all atoms of the chain to have attached fluoro substituents except the chain atom that is attached to the imide nitrogen. Useful chains having such fluoro substituents include 1H,1H-perfluorooctyl and 1H,1H-perfluorobutyl, with H having the above-specified meaning.

It is also possible to form naphthalene 1,4,5,8-tetracarboxylic diimides that are substantially transparent in the visible region of the spectrum. Specifically, the compound advantageously exhibits an extinction coefficient, ∈, less than 1000 at visible wavelengths above 450 nm. (See, e.g., M. Adachi et al., "Spectral Similarity and Difference of Naphthalenetetracarboxylic Dianhydride, Perylenetetracarboxylic Dianhydride, and Their Derivatives," *J. Phys. Chem.*, Vol. 99, 14240 (1995).) Thus, according to the invention, it is possible to form an n-type semiconductor compound exhibiting the combination of a mobility greater than 0.01 $cm^2/Vs$ and substantial transparency in the visible region of the spectrum.

The n-channel semiconductor films are capable of being formed on any suitable substrate. Examples of such substrates include silicon dioxide, other oxides such as alumina, glass, e.g., spin-on glass, and dielectric polymeric materials, e.g., liquid phase processable materials such as polyimides. A variety of gate and electrode materials, as known in the art, are also suitable, including printable materials such as carbon ink or silver-epoxy. Various contact configurations are also contemplated.

The semiconductor films of the invention are deposited onto a substrate by any suitable method. As reflected in the examples, deposition into a film from solution is possible, e.g., by techniques such as disclosed in co-filed, co-assigned application entitled "Process for Fabricating Organic Circuits" (our reference Katz-Li 30-1). Deposition by a rapid sublimation method is also possible. One such method is to apply a vacuum of $10^{-3}$–$10^{-4}$ torr to a chamber containing a substrate and a source vessel that holds the compound in powdered form, and heat the vessel over several seconds until the compound sublimes onto the substrate. The mobility of such films is capable of being increased by carefully controlling the heating rate, maximum source temperature, and/or substrate temperature during the process. Conventional sublimation is also possible. Generally, the most useful compounds form as well ordered films, with amorphous films being less useful.

Devices for which the n-channel semiconductor films of the invention are useful include single thin film transistors and complementary inverter circuits. Other devices in which TFTs are useful, such as ring oscillators, and more complex circuits, e.g., shift registers, are also possible.

The invention will be further clarified by the following examples, which are intended to be exemplary.

Synthesis Procedure

Synthesis of naphthalenetetracarboxylic acid diimides: A mixture of naphthalene tetracarboxylic acid dianhydride (available from Aldrich Chemical Company), a 50–100% excess of an amine (per anhydride group), i.e., 1H,1H-perfluorooctylamine, octylamine, or 1H,1H-perfluorobutylamine (available from Aldrich or Lancaster Synthesis), zinc acetate (0.8 equivalents per dianhydride molecule), and 10–15 mL of quinoline per gram of dianhydride molecule was heated over several hours until a temperature of about 220° C. was reached. The mixture was allowed to cool, and precipitated solids were collected, washed with 50–100 mL (per gram of initial dianhydride) each of boiling 2% aqueous $Na_2CO_3$, boiling water, and toluene kept below the temperature at which the product would be substantially dissolved. The solid was then sublimed at $10^{31\ 3}$ to $10^{-4}$ torr.

Fabrication of Vapor Phase-deposited TFTs

A silicon substrate coated with 3000 Angstroms of $SiO_2$ was loaded into a vacuum chamber on a temperature-controlled copper block. The temperature of the block was capable of being raised, and a film of a naphthalene tetracarboxylic acid diimide compound was evaporated onto the substrate, generally about 500 Angstroms thick. A small region of the film and oxide was scratched away, and gold source and drain electrodes and a gate contact were then deposited through a shadow mask. (1000 Å thick gold typically provided useful contact) Mobilities and on/off ratios were determined from devices of width to length ratios of about 4 to 20, scanning a range of zero to 100 volts for both the drain-source and gate-source voltages.

EXAMPLE 1

For N,N'-bis(1H,1H-perfluorooctyl)-naphthalene-1,4,5,8-tetracarboxylic acid diimide, with the copper block at 70° C., a mobility of 0.06 $cm^2$/Vs and an on/off ratio of 300,000 were obtained. When the block was left at ambient temperature (about 25° C.), the mobility was 0.01 $cm^2$/Vs and the on/off ratio was 20,000. At 53° C., the mobility was 0.02 $cm^2$/Vs and the on/off ratio was 50,000. At 100° C., the mobility was 0.03 $cm^2$/Vs and the on/off ratio was above 100,000. All properties were measured in air.

EXAMPLE 2

Using N,N'-bis(1H,1H-perfluorobutyl)-naphthalene-1,4,5,8-tetracarboxylic acid diimide, at 68° C., the mobility was 0.01 $cm^2$/Vs, with an on/off ratio of 40,000, measured in air.

EXAMPLE 3

For N,N'-dioctyl naphthalene-1,4,5,8-tetracarboxylic acid diimide, the mobility was between 0.1 and 0.2 $cm^2$/Vs, when measured under high vacuum after several days' pumping with a turbopump. The on/off ratio under these conditions was 300,000.

EXAMPLE 4

For N,N'-bis(4-trifluoromethylbenzyl)napthalene-1,4,5,8-tetracarboxylic acid diimide deposited with the block at 98° C., the mobility was 0.09 $cm^2$/Vs. The on/off ratio was 100. With the block at 90° C., the on/off ratio was 180. (And, also for this 90° C. temperature, when a gate voltage of –60V was used for the "off" condition (with the device electrically isolated), the on/off ratio was 30,000.)

Fabrication of Solution-deposited TFTs

EXAMPLE 4

A solution of N,N'-bis(1H,1H-perfluorooctyl) naphthalene-1,4,5,8-tetracarboxylic diimide, 400 parts per million by weight, in α,α,α,-trifluorotoluene, was prepared by gentle heating. This solution was cast onto a silicon/SiO$_2$ substrate that had been preheated to about 100° C. The solvent evaporated within about 2 minutes. A 1 $cm^2$ region of the substrate became coated with a thin deposit that showed significant n-channel activity when tested with gold electrodes as above. The highest mobility obtained was 0.07 $cm^2$/Vs measured in air with a device width/length ratio of 1.7, although other parts of the area showed mobility an order of magnitude lower.

EXAMPLE 5

A 200 ppm solution of N,N'-bis(1H,1H-perfluorooctyl) naphthalene-1,4,5,8-tetracarboxylic diimide was used, on a substrate that was additionally treated with mostly monomeric 1H,1H,2H,2H-perfluorodecyltriethoxysilane, 0.5% solution in xylene, for 15 minutes at 70° C. The mobility was about 0.005 $cm^2$/Vs measured on the same sized device as Example 4, but the mobility varied by less than a factor of three over the entire active area.

EXAMPLE 6

Fabrication of Complementary Circuit

An uncoated region of the 400 ppm, untreated substrate sample from Example 4 was used to cast a film of 5,5'''-dihexyl-2,2',5',2'',5'',2''', 5''',2''''-quinquethiophene from a 400 ppm toluene solution at, 100° C. under vacuum, as described in co-filed application "Process for Fabricating Organic Circuits", discussed above. Gold electrodes were deposited on the thienyl compound. Inverter circuits were constructed by connecting the drain electrode of a diimide device with the drain electrode of a thienyl device, and forming an output contact from the connection. The effective W/L ratio of the thienyl devices ranged from 1.7 to 0.1. The output was switched between ±0–10 volts and ±68–98 volts by sweeping the gate over a range of 60 volts and applying a voltage of 100 volts to the source of the thienyl device, or –100 volts to the source of the diimide device. Output voltage differentials as high as 95 volts and gains as high as 10 were observed.

Fabrication by Rapid Sublimation

EXAMPLE 7

A device was fabricated by mounting a Si/SiO$_2$ substrate and N,N'-bis(1H,1H-perfluorooctyl)naphthalene-1,4,5,8-tetracarboxylic acid diimide source in a bell jar evaporator. The pressure was lowered to below $10^{-3}$ torr, but above $10^{-4}$ torr. The source was heated, and sublimation began within 20 seconds. A film of material was deposited onto the substrate in about 5 seconds. The source was allowed to cool, and carbon electrodes were painted onto the film with a paint brush using carbon black suspended in isopropanol. The sample was heated for 5 seconds to about 70 degrees to remove solvent. The mobility was 0.003 $cm^2$/Vs and the on/off ratio was about 300.

Other embodiments of the invention will be apparent to those skilled in the art from consideration of the specification and practice of the invention disclosed herein.

What is claimed is:

1. A process for fabricating a device, comprising the step of depositing onto a substrate an n-channel semiconducting film that comprises a fused-ring tetracarboxylic diimide compound, such that the film exhibits a field effect electron mobility greater than 0.001 $cm^2$/Vs, and forming a source electrode and a drain electrode, such that the source electrode and the drain electrode are in contact with the n-channel semiconducting film.

2. The process of claim 1, wherein the compound comprises a naphthalene structure or an anthracene structure.

3. The process of claim 1, wherein the compound is selected from a naphthalene 1,4,5,8 tetracarboxylic acid diimide, a naphthalene 2,3,6,7 tetracarboxylic acid diimide, an anthracene 2,3,6,7 tetracarboxylic acid diimide, and heterocyclic variations of the naphthalene 1,4,5,8 tetracarboxylic acid diimide, the naphthalene 2,3,6,7 tetracarboxylic acid diimide, or the anthracene 2,3,6,7 tetracarboxylic acid diimide.

4. The process of claim 1, wherein the compound is deposited by a technique selected from sublimation, solution phase deposition, and rapid sublimation, and wherein the substrate temperature is no more than 100° C. during the deposition.

5. The process of claim 3, wherein the compound is selected from a N,N'-bis(1H,1H-perfluorooctyl)-naphthalene-1,4,5,8-tetracarboxylic acid diimide, a N,N'-bis(1H,1H-perfluorobutyl)-naphthalene-1,4,5,8-tetracarboxylic acid diimide, a N,N'-dioctylnaphthalene-1,4,5,8-tetracarboxylic acid diimide, and N,N'-bis(4-trifluoromethylbenzyl)napthalene-1,4,5,8-tetracarboxylic acid diimide.

* * * * *